(12) United States Patent
Sasaki et al.

(10) Patent No.: US 10,276,754 B2
(45) Date of Patent: Apr. 30, 2019

(54) METHOD FOR THE FLUIDIC ASSEMBLY OF EMISSIVE DISPLAYS

(71) Applicant: eLux Inc., Vancouver, WA (US)

(72) Inventors: Kenji Sasaki, West Linn, OR (US);
Paul J. Schuele, Washougal, WA (US);
Kurt Ulmer, Vancouver, WA (US);
Jong-Jan Lee, Camas, WA (US)

(73) Assignee: eLux, Inc., Vancouver, WA (US)

( * ) Notice: Subject to any disclaimer, the term of this patent is extended or adjusted under 35 U.S.C. 154(b) by 0 days.

(21) Appl. No.: 15/927,546

(22) Filed: Mar. 21, 2018

(65) Prior Publication Data

US 2018/0219138 A1 Aug. 2, 2018

Related U.S. Application Data

(60) Division of application No. 15/412,731, filed on Jan. 23, 2017, which is a continuation-in-part of
(Continued)

(51) Int. Cl.
*H01L 21/673* (2006.01)
*H01L 33/48* (2010.01)
(Continued)

(52) U.S. Cl.
CPC ............ *H01L 33/486* (2013.01); *H01L 27/32* (2013.01); *H01L 33/20* (2013.01); *H01L 33/62* (2013.01);
(Continued)

(58) Field of Classification Search
CPC ... H01L 33/005; H01L 33/0095; H01L 33/20; H01L 33/48; H01L 33/483–33/486; H01L 33/62; H01L 2933/0033; H01L 2933/0066; H01L 25/04–25/042; H01L 25/048; H01L 25/065–25/0655; H01L 25/072; H01L 25/075–25/0753; H01L 25/105;
(Continued)

(56) References Cited

U.S. PATENT DOCUMENTS 5,355,577 A * 10/1994 Cohn .................... B82Y 30/00
29/592.1
5,545,291 A * 8/1996 Smith ................... G02F 1/1362
257/E21.505

(Continued)

*Primary Examiner* — Maliheh Malek
(74) *Attorney, Agent, or Firm* — Law Office of Gerald Maliszewski; Gerald Maliszewski

(57) ABSTRACT

Fluidic assembly methods are presented for the fabrication of emissive displays. An emissive substrate is provided with a top surface, and a first plurality of wells formed in the top surface. Each well has a bottom surface with a first electrical interface. Also provided is a liquid suspension of emissive elements. The suspension is flowed across the emissive substrate and the emissive elements are captured in the wells. As a result of annealing the emissive substrate, electrical connections are made between each emissive element to the first electrical interface of a corresponding well. A eutectic solder interface metal on either the substrate or the emissive element is desirable as well as the use of a fluxing agent prior to thermal anneal. The emissive element may be a surface mount light emitting diode (SMLED) with two electrical contacts on its top surface (adjacent to the bottom surfaces of the wells).

28 Claims, 11 Drawing Sheets

Related U.S. Application Data application No. 15/410,195, filed on Jan. 19, 2017, which is a continuation-in-part of application No. 15/410,001, filed on Jan. 19, 2017, now Pat. No. 9,825,202, which is a continuation-in-part of application No. 14/749,569, filed on Jun. 24, 2015, now Pat. No. 9,722,145, and a continuation-in-part of application No. 15/221,571, filed on Jul. 27, 2016, now Pat. No. 9,755,110, and a continuation-in-part of application No. 15/197,226, filed on Jun. 29, 2016, now Pat. No. 9,823,885, and a continuation-in-part of application No. 15/190,813, filed on Jun. 23, 2016, now Pat. No. 9,892,944, and a continuation-in-part of application No. 15/158,556, filed on May 18, 2016, now Pat. No. 9,985,190, and a continuation-in-part of application No. 15/266,796, filed on Sep. 15, 2016, now Pat. No. 9,917,226, and a continuation-in-part of application No. 14/680,618, filed on Apr. 7, 2015, which is a continuation-in-part of application No. 14/530,230, filed on Oct. 31, 2014, now abandoned.

(51) Int. Cl.
*H01L 33/20* (2010.01)
*H01L 27/32* (2006.01)
*H01L 33/62* (2010.01)
*H01L 25/075* (2006.01)

(52) U.S. Cl.
CPC ............ *H01L 25/0753* (2013.01); *H01L 2224/95101* (2013.01); *H01L 2933/0033* (2013.01); *H01L 2933/0066* (2013.01)

(58) Field of Classification Search
CPC ........ H01L 25/13; H01L 25/16–25/167; H01L 25/18; H01L 2225/03; H01L 2225/04; H01L 2225/065; H01L 27/08; H01L 27/0814; H01L 27/10; H01L 21/67121; H01L 21/6733; H01L 2224/93–2224/95085; H01L 24/90–24/93; H01L 24/95–24/96; G01N 21/88–21/8806; G01N 21/8851; G01N 21/95623; G01N 2021/8809; G01N 2021/8845; G01N 2021/8854–2021/8896

See application file for complete search history.

(56) References Cited

U.S. PATENT DOCUMENTS

| | | | | |
|---|---|---|---|---|
| 5,824,186 A * | 10/1998 | Smith | G02F 1/1362 | 438/597 |
| 5,954,898 A * | 9/1999 | McKague | B29C 70/342 | 156/182 |
| 5,963,662 A * | 10/1999 | Vachtsevanos | G01N 21/88 | 250/332 |
| 6,246,787 B1 * | 6/2001 | Hennessey | G01N 21/95607 | 250/559.45 |
| 6,292,582 B1 * | 9/2001 | Lin | G01N 21/95607 | 257/E23.179 |
| 6,316,278 B1 * | 11/2001 | Jacobsen | G02F 1/1345 | 257/E21.705 |
| 6,590,346 B1 * | 7/2003 | Hadley | H01L 23/5389 | 257/E21.705 |
| 6,599,769 B2 * | 7/2003 | Kondo | G02B 6/29361 | 257/E25.02 |
| 6,731,353 B1 * | 5/2004 | Credelle | H01L 21/67144 | 257/723 |
| 6,756,796 B2 * | 6/2004 | Subramanian | H01L 21/67259 | 257/E23.179 |
| 6,850,312 B2 * | 2/2005 | Jacobsen | G02F 1/133305 | 349/187 |
| 6,864,570 B2 * | 3/2005 | Smith | G02F 1/1362 | 257/701 |
| 6,927,382 B2 * | 8/2005 | King | H01L 24/95 | 250/214.1 |
| 7,080,444 B1 * | 7/2006 | Craig | H01L 21/67144 | 257/E21.705 |
| 7,162,035 B1 * | 1/2007 | Durst | G06K 19/086 | 380/54 |
| 7,223,635 B1 * | 5/2007 | Brewer | B81C 3/002 | 257/E21.505 |
| 7,321,159 B2 * | 1/2008 | Schatz | H01L 24/95 | 257/559 |
| 7,452,748 B1 * | 11/2008 | Craig | G06K 19/07718 | 257/E21.511 |
| 7,662,008 B2 * | 2/2010 | Hillis | G09G 3/001 | 445/23 |
| 7,687,277 B2 * | 3/2010 | Sharma | H01L 24/95 | 436/174 |
| 7,727,788 B2 * | 6/2010 | Han | H01L 24/95 | 257/E21.085 |
| 7,727,804 B2 * | 6/2010 | Smith | G02F 1/1362 | 257/E21.598 |
| 7,931,063 B2 * | 4/2011 | Craig | G06K 19/07718 | 156/379.6 |
| 7,943,052 B2 * | 5/2011 | Wu | B23K 3/0623 | 216/20 |
| 8,300,007 B2 * | 10/2012 | Hillis | G09F 9/30 | 345/107 |
| 8,349,116 B1 * | 1/2013 | Bibl | H01L 21/67144 | 156/249 |
| 8,384,630 B2 * | 2/2013 | Ray | B82Y 20/00 | 345/82 |
| 8,390,537 B2 * | 3/2013 | Hillis | G09F 9/30 | 257/88 |
| 8,570,482 B2 * | 10/2013 | Hillis | H01L 25/046 | 349/187 |
| 8,696,818 B2 * | 4/2014 | Robinson | B03C 7/006 | 134/10 |
| 8,780,097 B2 * | 7/2014 | Xu | G09G 3/006 | 345/204 |
| 8,791,474 B1 * | 7/2014 | Bibl | G09G 3/2003 | 257/100 |
| 8,896,907 B2 * | 11/2014 | Tweet | G02F 1/133553 | 359/296 |
| 9,018,833 B2 * | 4/2015 | Lowenthal | H01L 25/048 | 313/503 |
| 9,111,464 B2 * | 8/2015 | Bibl | G02F 1/133603 | |
| 9,217,541 B2 * | 12/2015 | Bathurst | F21K 9/00 | |
| 9,378,993 B2 * | 6/2016 | Hosaka | H01L 21/67132 | |
| 9,531,002 B2 * | 12/2016 | Lu | H01M 4/136 | |
| 9,534,772 B2 * | 1/2017 | Lowenthal | F21K 9/27 | |
| 9,554,484 B2 * | 1/2017 | Rogers | A61B 5/01 | |
| 9,583,466 B2 * | 2/2017 | McGroddy | H01L 25/0753 | |
| 9,627,437 B1 * | 4/2017 | Ulmer | H01L 27/156 | |
| 9,647,029 B2 * | 5/2017 | Lo | H01L 27/156 | |
| 9,755,110 B1 * | 9/2017 | Crowder | H01L 27/156 | |
| 9,825,202 B2 * | 11/2017 | Schuele | H01L 33/0079 | |
| 9,837,390 B1 * | 12/2017 | Sorensen | H01L 25/0753 | |
| 9,865,767 B2 * | 1/2018 | Ray | B82Y 20/00 | |
| 9,892,944 B2 * | 2/2018 | Schuele | H01L 29/0657 | |
| 9,917,226 B1 * | 3/2018 | Heine | H01L 33/005 | |
| 10,032,957 B2 * | 7/2018 | Crowder | H01L 27/156 | |
| 2001/0031514 A1 * | 10/2001 | Smith | G02F 1/1362 | 438/107 |
| 2002/0005294 A1 * | 1/2002 | Mayer | B82Y 30/00 | 174/260 |
| 2002/0041149 A1 * | 4/2002 | Shimoda | H05B 33/10 | 313/504 |
| 2002/0053065 A1 * | 5/2002 | Mitsutake | H01L 22/20 | 700/110 |
| 2003/0186469 A1 * | 10/2003 | Fonstad, Jr. | H01L 21/2007 | 438/3 |
| 2004/0045931 A1 * | 3/2004 | Hill | B41M 3/008 | 216/54 |

(56) References Cited

U.S. PATENT DOCUMENTS

| | | | |
|---|---|---|---|
| 2004/0106334 A1* | 6/2004 | Suzuki | B23K 3/0607 439/894 |
| 2004/0137730 A1* | 7/2004 | Kim | B82Y 10/00 438/689 |
| 2004/0179145 A1* | 9/2004 | Jacobsen | G02F 1/133305 349/45 |
| 2004/0222357 A1* | 11/2004 | King | H01L 24/95 250/214.1 |
| 2005/0047644 A1* | 3/2005 | Wong | G01N 21/8806 382/141 |
| 2005/0164485 A1* | 7/2005 | Onozawa | H01L 24/95 438/616 |
| 2005/0176170 A1* | 8/2005 | Detig | G03G 15/10 438/106 |
| 2005/0196589 A1* | 9/2005 | Watanabe | H01L 24/95 428/172 |
| 2005/0255620 A1* | 11/2005 | Hadley | G02F 1/133305 438/28 |
| 2006/0048384 A1* | 3/2006 | Ricks | H01L 23/345 29/850 |
| 2006/0051517 A1* | 3/2006 | Haas | H01L 23/345 427/457 |
| 2006/0057293 A1* | 3/2006 | Sharma | H01L 24/86 427/372.2 |
| 2006/0164647 A1* | 7/2006 | Shibata | G01N 21/89 356/430 |
| 2006/0220989 A1* | 10/2006 | Hillis | G09G 3/001 345/30 |
| 2006/0223225 A1* | 10/2006 | Arneson | H01L 21/67144 438/106 |
| 2006/0232769 A1* | 10/2006 | Sugihara | G01N 21/95692 356/237.2 |
| 2007/0040688 A1* | 2/2007 | Cocita | G06K 19/07718 340/572.7 |
| 2007/0080703 A1* | 4/2007 | Ding | G01N 21/95684 324/750.07 |
| 2007/0224713 A1* | 9/2007 | Han | H01L 24/95 438/26 |
| 2008/0023435 A1* | 1/2008 | Wu | B23K 3/0623 216/2 |
| 2008/0181363 A1* | 7/2008 | Fenter | G01N 23/20 378/70 |
| 2009/0059204 A1* | 3/2009 | Harris | G01J 3/46 356/51 |
| 2009/0136120 A1* | 5/2009 | Onushkin | G01N 21/95 382/149 |
| 2009/0218260 A1* | 9/2009 | Chow | B81C 99/002 209/577 |
| 2009/0267096 A1* | 10/2009 | Kim | H01L 33/0079 257/98 |
| 2010/0122654 A1* | 5/2010 | Sharma | H01L 24/86 118/69 |
| 2010/0317132 A1* | 12/2010 | Rogers | H01L 25/0753 438/27 |
| 2011/0159412 A1* | 6/2011 | Chun | G03F 1/82 430/5 |
| 2011/0205544 A1* | 8/2011 | Davis | G01R 29/0857 356/450 |
| 2011/0249111 A1* | 10/2011 | Weiss | H01L 22/12 348/87 |
| 2011/0277917 A1* | 11/2011 | Nakagawa | H01L 21/2007 156/150 |
| 2012/0028342 A1* | 2/2012 | Ismagilov | B01L 3/502738 435/283.1 |
| 2012/0056340 A1* | 3/2012 | Kitagawa | B32B 41/00 264/1.34 |
| 2012/0285010 A1* | 11/2012 | Witvrouw | H01L 24/50 29/832 |
| 2013/0100089 A1* | 4/2013 | Xu | G09G 3/006 345/204 |
| 2013/0122633 A1* | 5/2013 | Arase | G02B 3/0056 438/69 |
| 2013/0210194 A1* | 8/2013 | Bibl | H01L 24/83 438/107 |
| 2014/0002128 A1* | 1/2014 | Ohmart | G01R 31/318511 324/762.03 |
| 2014/0080261 A1* | 3/2014 | Arase | H01L 21/56 438/118 |
| 2014/0084240 A1* | 3/2014 | Hu | H01L 25/0753 257/13 |
| 2014/0119796 A1* | 5/2014 | Priebe | G03G 15/2096 399/340 |
| 2014/0159064 A1* | 6/2014 | Sakariya | H01L 25/0753 257/88 |
| 2014/0175481 A1* | 6/2014 | Tischler | H01L 24/96 257/98 |
| 2014/0176922 A1* | 6/2014 | Robinson | B03C 7/006 355/30 |
| 2014/0209945 A1* | 7/2014 | Baldridge | H01L 25/0753 257/91 |
| 2014/0210995 A1* | 7/2014 | Abe | G01R 31/2635 348/93 |
| 2014/0231834 A1* | 8/2014 | Lowenthal | H01L 25/0753 257/88 |
| 2014/0234994 A1* | 8/2014 | Abe | G01N 21/6489 438/16 |
| 2014/0302312 A1* | 10/2014 | Singh | C08J 7/06 428/338 |
| 2014/0306244 A1* | 10/2014 | Oraw | H01L 33/40 257/88 |
| 2014/0334137 A1* | 11/2014 | Hasenoehrl | H01L 25/0753 362/147 |
| 2015/0028362 A1* | 1/2015 | Chan | H01L 27/156 257/88 |
| 2015/0155445 A1* | 6/2015 | Zhan | H01L 33/005 257/88 |
| 2015/0214430 A1* | 7/2015 | Zhan | H01L 33/20 257/13 |
| 2015/0236229 A1* | 8/2015 | Kim | H01L 33/62 257/99 |
| 2015/0249069 A1* | 9/2015 | Yoshida | H01L 33/62 257/89 |
| 2015/0325438 A1* | 11/2015 | Cho | H01B 1/06 438/502 |
| 2016/0104696 A1* | 4/2016 | LaVeigne | H01L 25/167 257/88 |
| 2016/0155892 A1* | 6/2016 | Li | H01L 24/00 257/89 |
| 2016/0263632 A1* | 9/2016 | Robinson | G03F 1/82 |
| 2016/0266165 A1* | 9/2016 | Robinson | G03F 7/0002 |
| 2017/0062393 A1* | 3/2017 | Kim | H01L 23/5385 |
| 2017/0133550 A1* | 5/2017 | Schuele | H01L 33/0079 |
| 2017/0139276 A1* | 5/2017 | Ulmer | G02F 1/133603 |
| 2017/0140961 A1* | 5/2017 | Sasaki | H01L 22/22 |
| 2017/0179092 A1* | 6/2017 | Sasaki | G09G 3/006 |
| 2017/0215280 A1* | 7/2017 | Chaji | H05K 1/111 |
| 2017/0330855 A1* | 11/2017 | Tung | H01L 24/83 |
| 2017/0338389 A1* | 11/2017 | Zhan | H01L 33/06 |
| 2017/0365755 A1* | 12/2017 | Chu | H01L 33/56 |
| 2017/0372927 A1* | 12/2017 | Schuele | H01L 29/0657 |
| 2018/0012873 A1* | 1/2018 | Lee | G09G 3/006 |
| 2018/0029038 A1* | 2/2018 | Sasaki | G09G 3/006 |
| 2018/0033915 A1* | 2/2018 | Crowder | H01L 27/156 |
| 2018/0047867 A1* | 2/2018 | Schuele | H01L 33/0079 |
| 2018/0076068 A1* | 3/2018 | Yuen | H01L 33/00 |
| 2018/0076168 A1* | 3/2018 | Stecker | H01L 33/62 |
| 2018/0102352 A1* | 4/2018 | Sasaki | H01L 25/50 |
| 2018/0138359 A1* | 5/2018 | Ulmer | H01L 33/06 |
| 2018/0144957 A1* | 5/2018 | Schuele | H01L 29/0657 |
| 2018/0158979 A1* | 6/2018 | Schuele | H01L 33/0079 |
| 2018/0190672 A1* | 7/2018 | Lee | H01L 25/0753 |
| 2018/0198032 A1* | 7/2018 | He | H01L 33/48 |
| 2018/0204973 A1* | 7/2018 | Jeung | H01L 33/00 |
| 2018/0219138 A1* | 8/2018 | Sasaki | H01L 33/486 |
| 2018/0219139 A1* | 8/2018 | Sasaki | H01L 33/486 |
| 2018/0309023 A1* | 10/2018 | Crowder | H01L 27/156 |
| 2018/0366622 A1* | 12/2018 | Ulmer | H01L 33/505 |

(56) References Cited

U.S. PATENT DOCUMENTS

| | | | |
|---|---|---|---|
| 2019/0006564 A1* | 1/2019 | Sasaki | H01L 23/3185 |
| 2019/0019929 A1* | 1/2019 | Lim | H01L 33/62 |
| 2019/0044023 A1* | 2/2019 | Cheng | H01L 33/0079 |

* cited by examiner

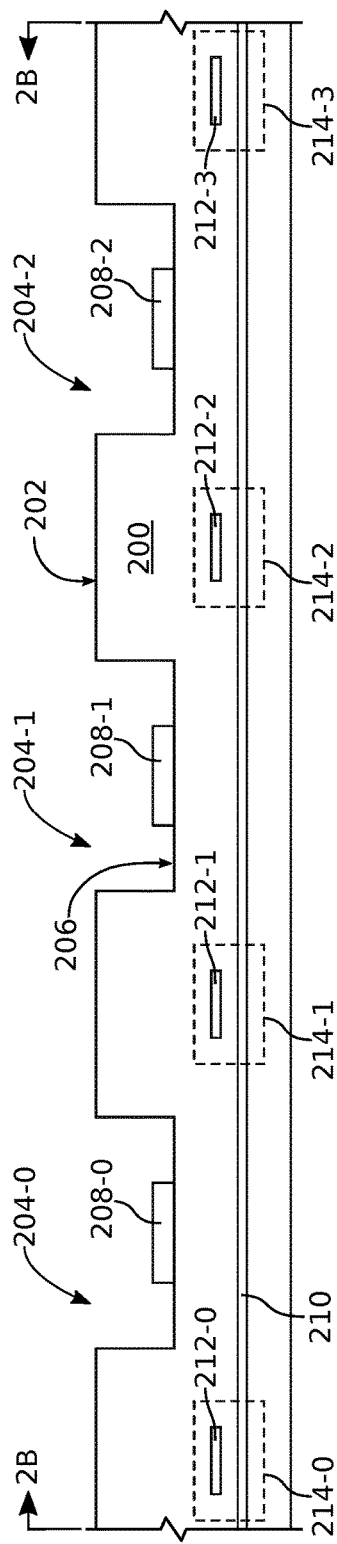
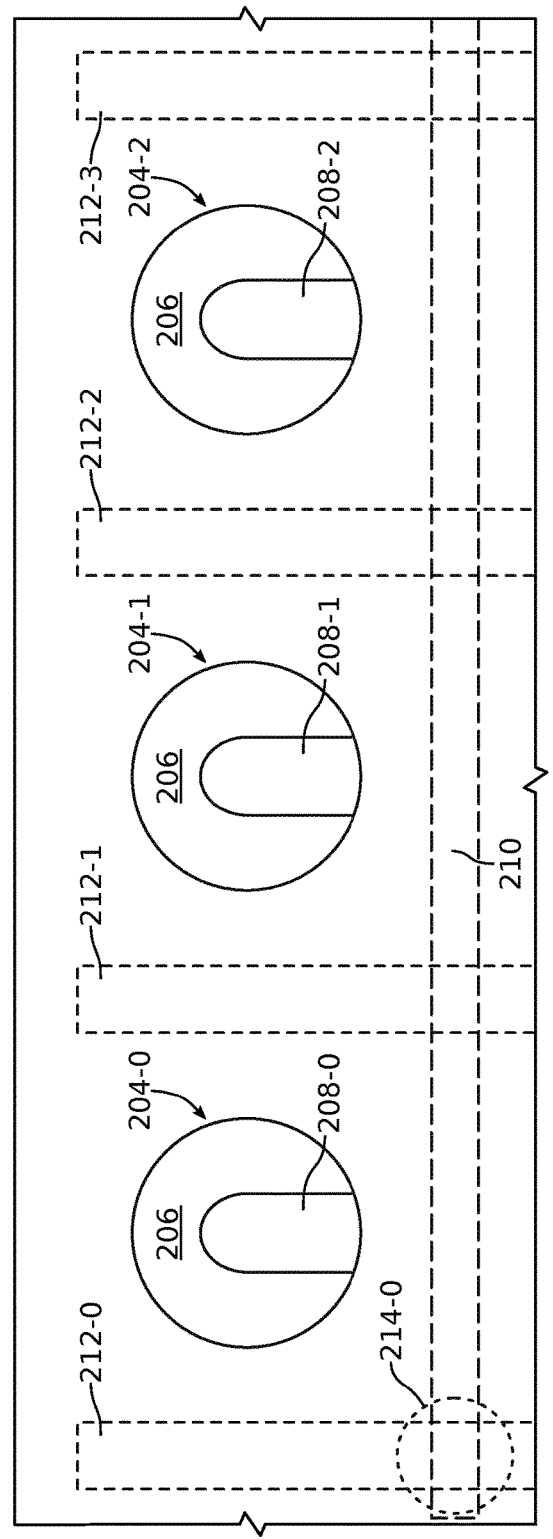
Fig. 2A
Fig. 2B

METHOD FOR THE FLUIDIC ASSEMBLY OF EMISSIVE DISPLAYS

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to integrated circuits (ICs) and, more particularly, to fluidic assembly method for the fabrication of emissive displays.

2. Description of the Related Art

The fluidic transfer of microfabricated electronic devices, optoelectronic devices, and sub-systems from a donor substrate/wafer to a large area and/or unconventional substrate provides a new opportunity to extend the application range of electronic and optoelectronic devices. For example, display pixel size light emitting diode (LED) micro structures, such as rods, fins, or disks, can be first fabricated on small size wafers and then be transferred to large panel glass substrate to make a direct emitting display. One conventional means of transferring these LED microstructures is through a pick-and-place process. However, with a display comprising millions of elements, such a process may take several hours to complete and is therefore inefficient.

The fluidic self-assembly of electronic devices, such as LEDs and concentrated photovoltaics, is often performed by surface energy minimization at molten solder capillary interfaces so that both mechanical and electrical connections can be made to an electrode during assembly, as demonstrated in U.S. Pat. No. 7,774,929. In one aspect, electronic devices are captured in shape-matched well structures, followed by electrical integration processes, as demonstrated in U.S. Pat. No. 6,316,278.

Some problems yet to be addressed with conventional fluidic assembly processes are related to the distribution method over large scales, the integration of microcomponents to drive circuitry over large areas, and the potential mechanisms for the repair of defective microcomponents. Over large scales, conventional fluidic assembly into wells is challenged by the dual requirements of maximum velocities for microcomponent capture and minimum distribution velocities for high-speed array assembly. Similarly, achieving the microcomponent dispense scheme and flow velocity uniformity necessary for a high yield over the whole assembly substrate becomes very challenging over greater-than-centimeter scales.

The integration of assembled microcomponents has been primarily done via photolithographically defined electrode deposition for microcomponents, or else by lamination of the second electrical contact in approaches where the first electrode contact is made as part of the assembly scheme. However, the photolithography of large substrates after fluidic assembly is potentially prohibitive due to the contaminating nature of any residual microcomponents on the substrate surface. Laminated top contacts have not demonstrated sufficiently reliable electrical connection to microcomponents for display applications.

Lastly, defect detection of electrically excited microcomponents is the most reliable and robust approach for inspection preceding repair. Assembled microcomponents with top-contact electrodes are at least partially held in an insulating matrix. Any repair that involves removal of defective microcomponents from this matrix is extremely difficult. Moreover, any similarly integrated microcomponents that are added to the array to compensate for defective microcomponents requires that the electrode contact process to be repeated. While technical workarounds may exist, they are expected to be more expensive, more time-intensive, and less reliable.

It would be advantageous if a fluidic assembly process could be used to efficiently transfer emissive elements to a display substrate with a minimum of process steps.

SUMMARY OF THE INVENTION

The fluidic assembly and orientation approach disclosed herein uses high-variance local forcing on individual microcomponents. The high variance in forcing results in a high variance in velocity such that insofar as a maximum assembly velocity exists for trapping, individual component velocities may fall below that maximum threshold and settle into wells. The second benefit to high variance is that the distribution of components over a large (meter-scale) substrate is relatively quick. Once settled into wells, the maximum forcing is such that assembled components are not dislodged from a correct orientation, but misoriented components are dislodged. This provides for a low-cost, high-speed assembly approach that has achieved an extrapolated assembly rate of over 56 million devices per hour. The assembly method is a general method that may be applicable to any number of substrates but is well suited to low-fill factor, high-area arrays with limited surface topography other than the wells for trapping.

Accordingly, a fluidic assembly method is provided for the fabrication of emissive displays. The method provides an emissive substrate with a top surface, and a plurality of wells formed in the top surface. Each well has a bottom surface with a first electrical interface, and a matrix of column and row traces forming a plurality of column/row intersections. Each column/row intersection is associated with a corresponding well. Also provided is a liquid suspension of emissive elements. The liquid may, for example, be an alcohol, polyol, ketone, halocarbon, or water. The method flows the suspension across the emissive substrate top surface and the emissive elements are captured in the wells. As a result of annealing the emissive substrate, electrical connections are made between each emissive element to the first electrical interface of a corresponding well. The liquid suspension may include a solder fluxing agent, or the solder fluxing agent may be applied in a separate step either prior to or subsequent to capturing the emissive elements in the wells and prior to annealing the substrate. Additional process steps may form color modifiers and light diffusers over selected wells.

A eutectic solder interface metal on either the substrate or the emissive element is desirable as well as the use of a fluxing agent prior to thermal anneal. For example, a dimethylammonium chloride, diethanolamine, and glycerol solution may be dissolved in isopropanol. This solution can be used as the assembly fluid (suspension) or it can be introduced after the assembly fluid is removed via sweeping and evaporation.

In some aspects, the emissive element is a surface mount light emitting diode (SMLED) with two electrical contacts on its top surface (the SMLED top surfaces faces into the well, adjacent to the bottom surfaces of the wells). The electrical connections between the emissive elements and the well first electrical interfaces are then made without the formation of overlying metal layers, additional conductive traces, or wire bonding on the substrate subsequent to annealing. Otherwise, if the emissive elements are vertical LEDs (with one electrical contact on the top surface and one electrical contact on the bottom surface), additional metallization steps may be required after annealing. Typically, as emissive elements are captured in the wells, uncaptured emissive elements are simultaneously collected and resuspended for subsequent emissive display fabrication.

In one aspect, an auxiliary mechanism is engaged for distributing the emissive elements over the substrate. Some examples of the auxiliary mechanism include a brush (rotating or non-rotating), wiper, rotating cylinder, pressurized fluid, and mechanical vibration (e.g., acoustic or ultrasonic). The auxiliary mechanism aids in the distribution, of the emissive elements across the substrate surface through contact or engagement with either the emissive elements in the suspension or with the emissive substrate top surface. For example, assuming the emissive substrate has a length and a width, the method flows the suspension across the emissive substrate top surface at a first velocity in a first direction across the length of the emissive substrate. An auxiliary mechanism brush, having a rotation axis and brush length at least equal to the emissive substrate width, translates the brush length across the length of the emissive substrate length in the first direction. Simultaneously with the first pass of brush translation, the brush is rotated to create a first local variance in the first velocity. In one aspect, the brush rotation creates a local variance greater than the first velocity. The method may further repeat the brush translation in the first direction, or in the opposite direction, and the brush rotation may create local variances either greater than or less than the first velocity. The brush may rotate at a rate in the range of 120 to 300 revolutions per minute (RPM) and translate across the emissive substrate top surface at a speed in the range of 3 to 10 centimeter per second (cm/s).

In one aspect, surface mount emissive elements are fabricated with a post extending from the bottom surface, or vertical structure emissive elements are fabricated with a post extending from their top surface. Then, as the liquid suspension is flowed across the substrate top surface the emissive elements move, at least partially, in response to torque created on the emissive element posts. Perhaps more important, the posts aid in capturing the emissive elements in the wells as a result of surface orienting the emissive element top surfaces directly overlying the well bottom surface.

Additional details of the above-described method, as well as methods for transferring differently shaped emissive elements to an emissive substrate are provided below.

BRIEF DESCRIPTION OF THE DRAWINGS

FIGS. 2A and 2B are, respectively, partial cross-sectional and plan views of an exemplary emissive substrate such as might be provided in Step 102 of FIG. 1.

DETAILED DESCRIPTION

Figure 1:
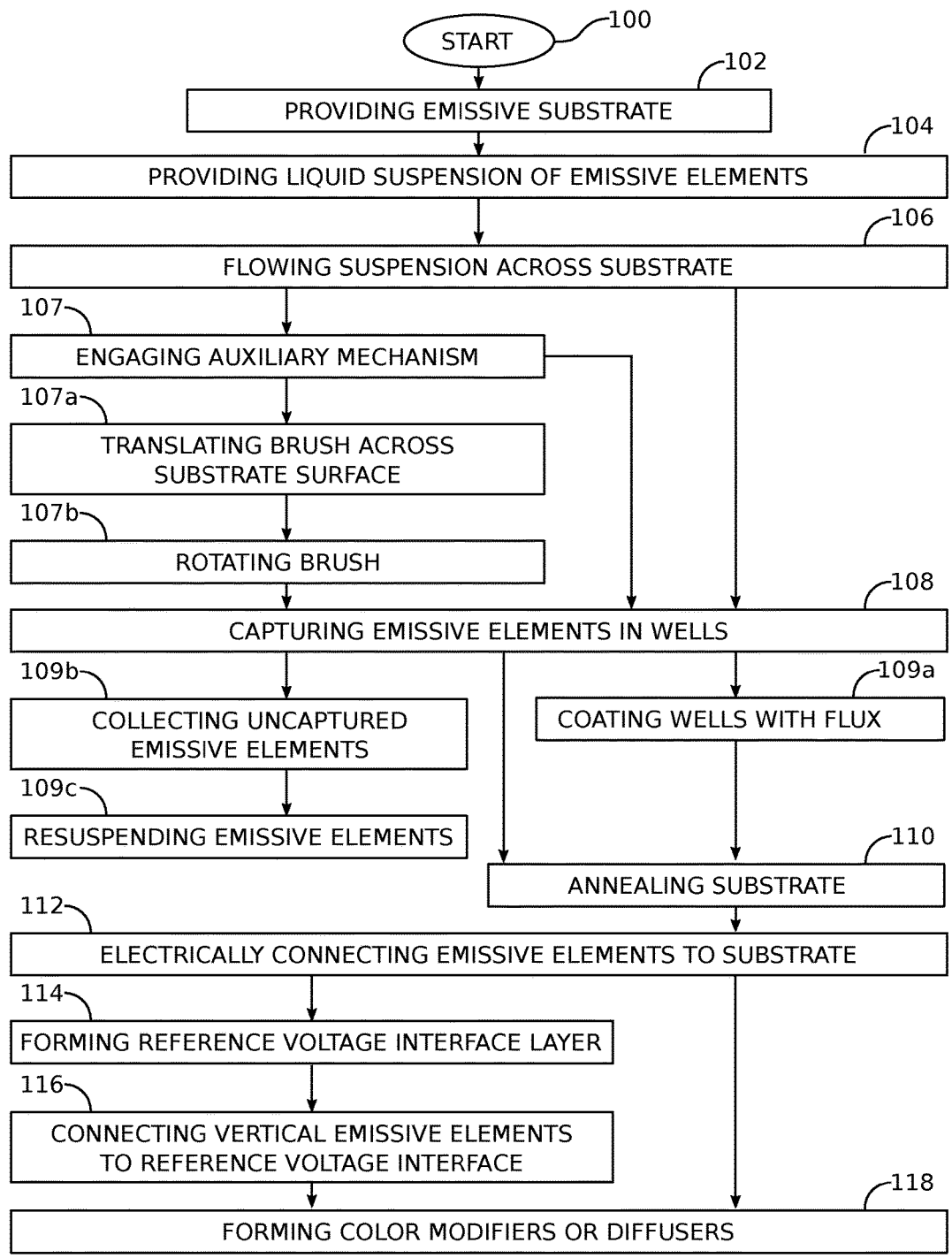
FIG. 1 is a flowchart illustrating a fluidic assembly method for the fabrication of emissive displays.

FIG. 1 is a flowchart illustrating a fluidic assembly method for the fabrication of emissive displays. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 100. Step 102 provides an emissive substrate.

FIGS. 2A and 2B are, respectively, partial cross-sectional and plan views of an exemplary emissive substrate such as might be provided in Step 102 of FIG. 1. The emissive substrate 200 has a top surface 202, and a first plurality of wells 204 formed in the top surface (wells 204-0 through 204-2 are shown). Typically, the substrate top surface 202 is planar, and the wells 204 are the only surface topographical feature affecting fluidic assembly. Each well 204 comprises a bottom surface 206 with a first electrical interface 208, which optionally may be solder-coated. First electrical interfaces 208-0 through 208-2 are shown. The emissive substrate is typically transparent and may be a multilayer structure (not shown) comprising a glass substrate with an overlying dielectric material into which the wells have been formed. The emissive substrate 200 also comprises a matrix of column traces 210 and row traces 212 forming a first plurality of column/row intersections 214. Row traces 212-0 through 212-3 are shown, as are column/row intersections 214-0 through 214-2. Each column/row intersection 214 is associated with a corresponding well 204. For example, column/row intersection 214-0 is associated with well 204-0. The column traces 210 and row traces 212 may form a simple passive matrix to selectively enable emissive elements, or be part of an active matrix for the same purpose, as explained in more detail below. For this reason, details of the interconnects between the column, rows, and electrical interfaces are not shown in this drawing.

Figure 11A:
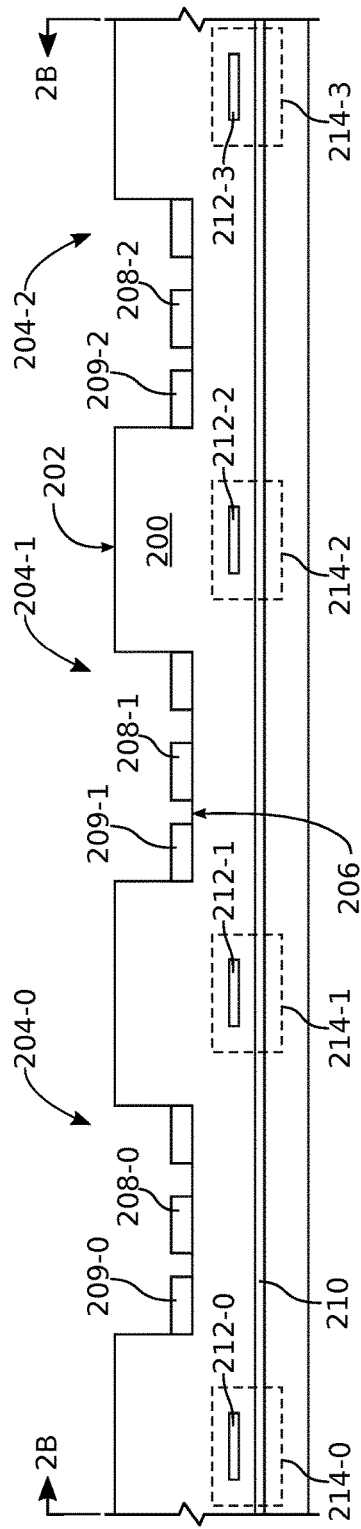
FIGS. 11A and 11B are, respectively, partial cross-sectional and plan views of a second exemplary emissive substrate such as might be provided in Step 102 of FIG. 1.
Figure 11B:
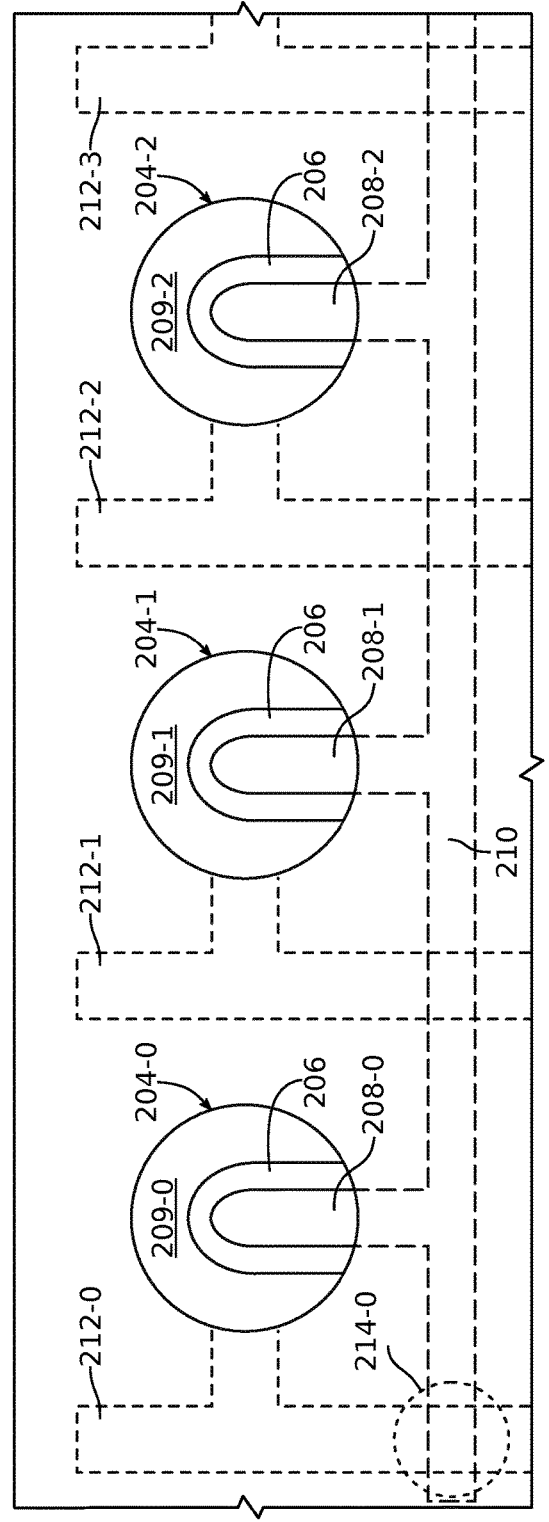

FIGS. 11A and 11B are, respectively, partial cross-sectional and plan views of a second exemplary emissive substrate such as might be provided in Step 102 of FIG. 1. In this aspect, the emissive elements are surface mount light emitting diodes (SMLEDs), as depicted in greater detail in FIGS. 4A and 4B. As explained below, the SMLEDs have two electrical contacts on their top surface, which is the surface interfacing the well bottoms 206. As a result, two electrical interfaces are formed on the well bottoms 206; they are first electrical interfaces 208-0 through 208-2 and second electrical interface 209-0 through 209-2. In this aspect the emissive substrate 200 is formed with a passive matrix of column and row traces to selectively enable the SMLEDs. As shown, column trace 210 is connected to the first electrical interface (208-0 through 208-2) in a column of wells 204-0 through 204-2, and row traces 212-0 through 212-2 are respectively connected to the second electrical interfaces (1100-0 through 1100-2) in the column of wells 204-0 through 204-2.

Returning to FIG. 1, Step 104 provides a liquid suspension of emissive elements, and Step 106 flows the suspension across the emissive substrate top surface. The liquid of Step 104 may be one of a number of types of alcohols, polyols, ketones, halocarbons, or water. Step 108 captures the emissive elements in the wells. In one aspect, Step 104 provides a liquid suspension of emissive elements that includes a solder fluxing agent. Alternatively or in addition, subsequent to capturing the emissive elements in the wells (Step 108) and prior to annealing the substrate (Step 110), Step 109a fills the emissive element populated wells with a solder fluxing agent.

Figure 3:
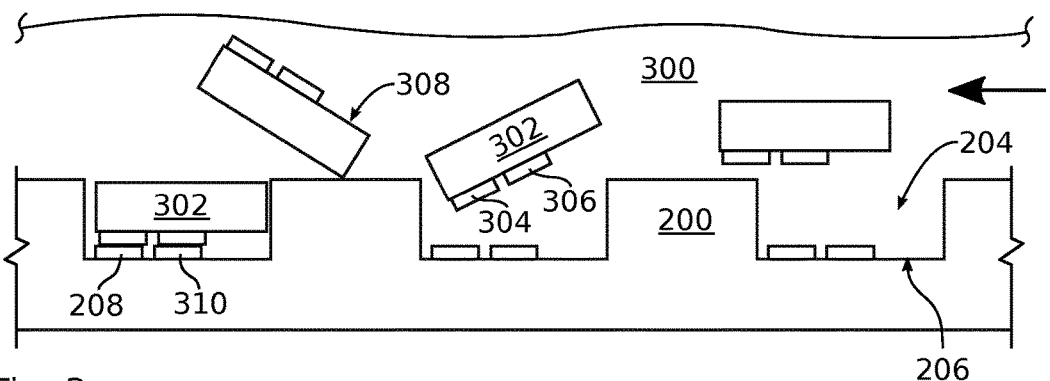
FIG. 3 is a partial cross-sectional view showing aspects in the performance of Steps 104 through 108 of FIG. 1.

FIG. 3 is a partial cross-sectional view showing aspects in the performance of Steps 104 through 108 of FIG. 1. Liquid suspension 300 includes emissive elements 302, some of which are captured in wells 204, with at least an emissive element first electrical contact 304. An emissive element second electrical contact 306 is also shown. Both contacts 304 and 306 are formed on the emissive element top surface 308. Likewise, a second electrical interface 310 is formed on each well bottom surface 206.

Returning to FIG. 1, Step 110 anneals the emissive substrate. In response to the annealing, Step 112 electrically connects each emissive element to the first electrical interface of a corresponding well. As noted above, the well's first electrical interface may be solder coated. Alternatively or in addition, an electrical contact or multiple electrical contacts on the emissive elements may be solder-coated. The annealing is performed at a high enough temperature to melt the solder being used.

A eutectic solder interface metal on either the substrate or the emissive element is desirable as well as the use of a fluxing agent prior to thermal anneal. Using atomic concentrations (at %), Au28/Ge62 solder eutectic has a melting point (MP) of 361° C., while the melting point for In49/Sn51 solder is 120° C. Pure indium is 156° C., but it suffers from the disadvantage of being unable to bond without pressure. The fluxing agent may be a dimethylammonium chloride, diethanolamine, and glycerol solution dissolved in isopropanol, an organic acid, or a rosin-type flux. This solution can be used as the assembly fluid (suspension) or it can be introduced after the assembly fluid is removed via sweeping and evaporation.

Figure 4A:
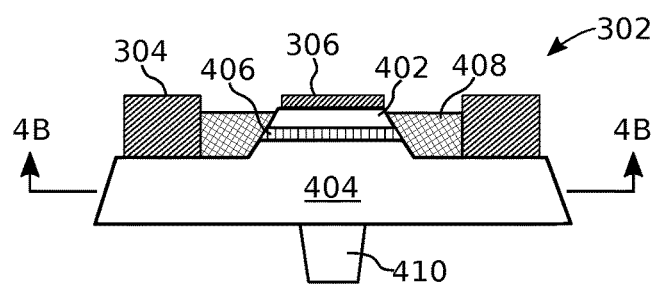
FIGS. 4A and 4B are, respectively, partial cross-sectional and plan views depicting an exemplary surface mount light emitting diode (SMLED).
Figure 4B:
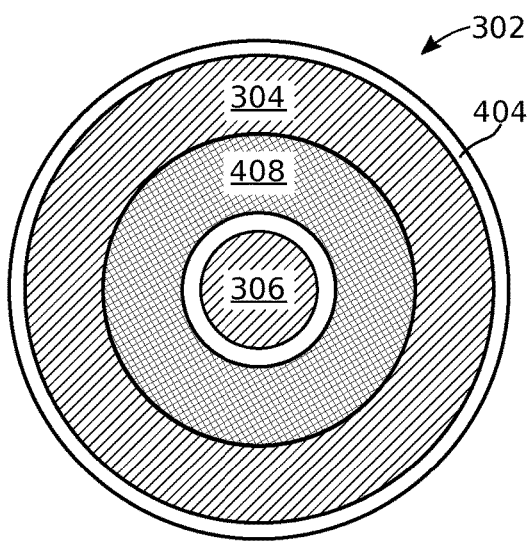

FIGS. 4A and 4B are, respectively, partial cross-sectional and plan views depicting an exemplary surface mount light emitting diode (SMLED). The emissive elements shown in FIG. 3 may, for example, be SMLEDs. The SMLED 302 comprises a first semiconductor layer 402, with either an n-dopant or a p-dopant. A second semiconductor layer 404 with the dopant not used in the first semiconductor layer 402. A multiple quantum well (MQW) layer 406 is interposed between the first semiconductor layer 402 and the second semiconductor layer 404. The MQW layer 406 may typically be a series of quantum well layers (typically 5 layers—e.g., alternating 5 nm of indium gallium nitride (InGaN) with 9 nm of n-doped GaN (n-GaN)) not shown. There may also be an aluminum gallium nitride (AlGaN) electron blocking layer (not shown) between MQW layers and the p-doped semiconductor layer. The outer layer may be p-doped GaN (Mg doping) about 200 nm thick. A high-brightness blue LED can be formed, or a green LED if a higher indium content is used in the MQW. The most practical first and second semiconductor layer materials are either gallium nitride (GaN), capable of emitting a blue or green light, or aluminum gallium indium phosphide (AlGaInP), capable of emitting red light.

In one aspect, the second electrical contact 304 is configured as a ring, and the second semiconductor layer 404 has a disk shape with a perimeter underlying the second electrical contact ring. The first electrical contact 306 is formed within a second electrical contact 304 ring perimeter, and the first semiconductor layer 402 and MQW layer 406 are a stack underlying the first electrical contact. A moat may be formed between the second electrical contact 304 ring and the first electrical contact 306, filled with an electrical insulator 408. Additional details of the SMLED are provided in the parent application entitled DISPLAY WITH SURFACE MOUNT EMISSIVE ELEMENT, invented by Schuele et al., Ser. No. 15/410,001, filed Jan. 19, 2017, which is incorporated herein by reference. Advantageously, if an SMLED is used, then electrically connecting each emissive element in Step 112 includes connecting each emissive element to the first electrical interface without the formation of overlying metal layers, additional conductive traces, wire bonding on the substrate subsequent to annealing, or the application of external pressure on the emissive element. In one aspect as shown, the SMLED includes a post 410 used for alignment and orientation.

More explicitly, Step 102 provides the emissive substrate with wells having a bottom surface with both the first electrical interface and a second electrical interface. If a passive matrix (PM) is used, the column and row traces are connected to the first and second electrical interfaces. If an active matrix (AM) is used, the column and row traces are used to enable a drive circuit associated with each well, whose output is connected to the first electrical interface. In the case of the AM, the matrix of traces in the emissive substrate would further comprise a line connecting dc power to each drive circuit. The emissive substrate would also include a reference voltage network of electrical interfaces connected to each well second electrical interface. Additional details of AM and PM enablement are provided in parent application Ser. No. 15/410,001.

Continuing, Step 104 provides a liquid suspension of surface mount emissive elements (e.g., SMLEDs) having a bottom surface and a top surface, with a first electrical contact and a second electrical contact formed on the top surface. Capturing the emissive elements in the wells in Step 108 includes capturing each surface mount emissive element top surface directly overlying a corresponding well bottom surface. Electrically connecting each emissive element to the first electrical interface in the corresponding well in response to the annealing (Step 112) includes electrically connecting each surface mount emissive element first electrical contact to a corresponding well first electrical interface and each emissive element second electrical contact to a corresponding well second electrical interface.

In a different aspect, Step 104 provides a liquid suspension of vertical emissive elements having a bottom surface with a first electrical contact and a top surface with a second electrical contact. Step 108 captures the emissive element bottom surface directly overlying a corresponding well bottom surface, and Step 112 electrically connects each emissive element first electrical contact to a corresponding well first electrical interface. In this aspect, subsequent to electrically connecting the emissive element first electrical contacts to corresponding well first electrical interfaces in Step 112, Step 114 forms a reference voltage interface layer overlying the emissive substrate top surface. As would be understood in the art, such a step may entail the deposition of an isolation layer over the substrate top surface, and etching to open contact holes through the isolation layer so that the subsequently formed reference voltage interface can be connected to the second electrical contacts. Step 116 connects the second electrical contact of each vertical emissive element to the reference voltage interface layer. For example, thin-film processes can be used to form metallization interconnects over the emissive substrate top surface. In the case of a passive matrix design using vertical emissive elements, a portion of the column/row matrix may be said to be provided in Step 102 (e.g., the column lines) and a portion of the column/row matrix (e.g., the row traces) are provided in Step 114.

In one aspect, Step 107 optionally engages an auxiliary mechanism for distributing the emissive elements. The auxiliary mechanism may, for example, be a brush (rotating or non-rotating), wiper, rotating cylinder, pressurized fluid, or mechanical vibration. A "fluid" may be either a gas or liquid. Examples of mechanical vibration include acoustical and ultrasonic vibration. Then, Step 108 captures the emissive elements, at least partially, in response to the auxiliary mechanism engaging the emissive elements in the suspension or engaging the emissive substrate top surface.

Figure 5:
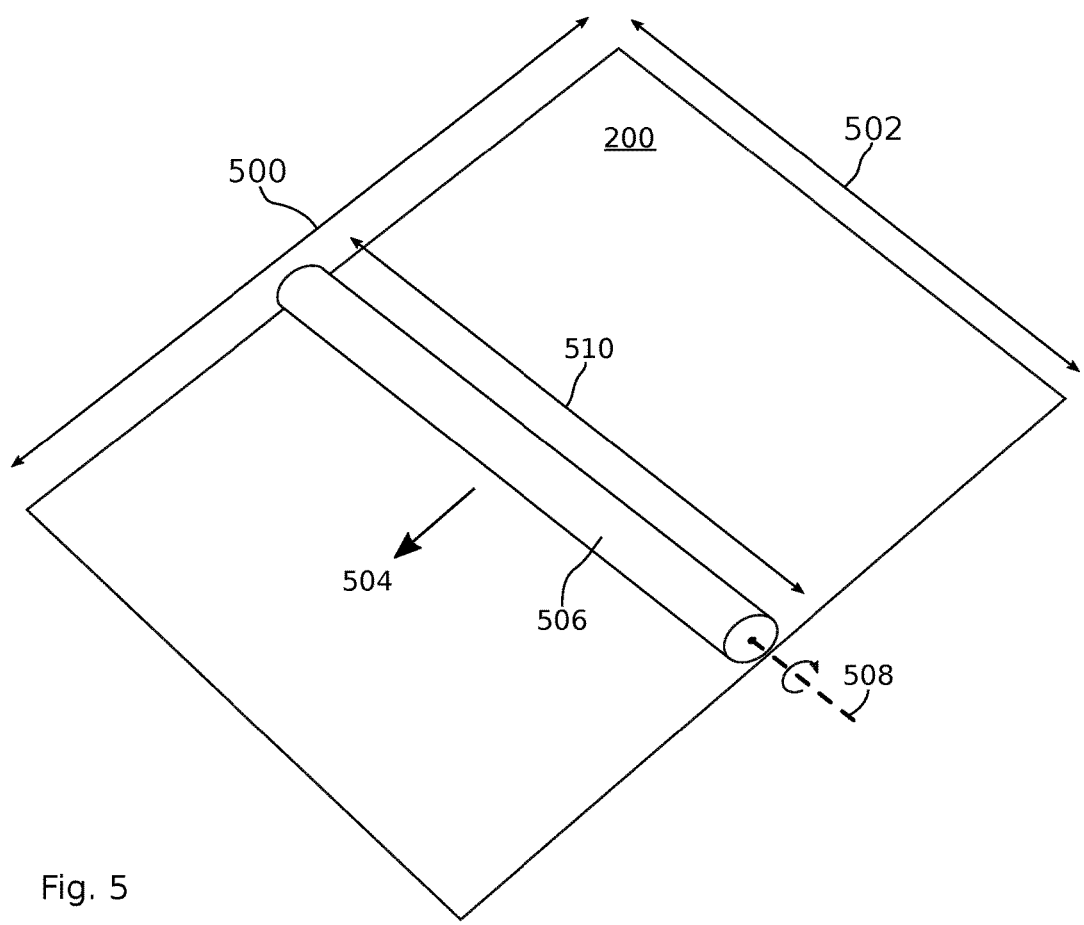
FIG. 5 is a perspective view depicting an exemplary brush auxiliary mechanism.

FIG. 5 is a perspective view depicting an exemplary brush auxiliary mechanism. Referencing FIGS. 1 and 5, Step 102 provides an emissive substrate 200 having a length 500 and a width 502. Step 106 supplies the suspension at a first velocity in a first direction 504 across the length 500 of the emissive substrate 200. Then, Step 107 engages a brush 506, having a rotation axis 508 and brush length 510 at least equal to the emissive substrate width 502 in the following substeps, Step 107a, in a first pass, translates the brush length 510 across the emissive substrate length 500 in the first direction 504. In one aspect, Step 107a translates the brush at a speed in the range of 3 to 10 centimeter per second (cm/s). Simultaneously with the first pass of brush translation, Step 107b rotates the brush to create a first local variance in the first velocity. As shown, the first local variation is a greater velocity than the first velocity. Alternatively, the first local variation may be lesser velocity than the first velocity. In one aspect, Step 107b rotates the brush at a rate in the range of 120 to 300 revolutions per minute (RPM). In one example, the brush linear velocity at the substrate surface is 35 cm/s, and a low-velocity trapping region occurs in the moving front of suspension pushed out by the brush.

For example, a cylindrical brush used as an auxiliary mechanism may have an outer diameter of 50 mm and be composed of 75 micron diameter nylon or polypropylene bristles in 3 mm tufts arrayed in a close-packed, spiral pattern or two-direction spiral pattern at a 6 mm center-center tuft spacing. These dimensions are given to illustrate a cylindrical brush that has fine, close-packed bristles made of a non-marring material with desirable interactions with both microcomponents and carrier fluid.

In one particular example the brush starts at a first edge of the substrate. In a first step, the brush moves to the second edge of the substrate, rotating counterclockwise to increase the local variance. In a second step the brush stops a short distance from second edge, and the rotation reverses to clockwise. In a third step the brush continues move to the second edge, but then reverses translation towards first edge, still rotating clockwise. In a fourth step the brush stops a short distance from the first edge, and rotation reverses to counterclockwise. In a fifth step the brush finishes the translation to the first edge. Optionally, the above-described steps may be repeated.

The first velocity flow speed may be gravity-driven if the substrate is tilted at an angle. The flow velocity may also oscillate or pulse. It should also be appreciated that the velocity of the emissive elements in the suspension is not necessarily the same as the velocity of the liquid. As used herein, the first velocity refers to the liquid velocity.

In one aspect, the liquid suspension disposes a high concentration of ~2-8 micron thick LEDs with diameters or maximum cross-sectional dimensions of 20 to 150 microns suspended in isopropanol. A low thickness of isopropanol exists over the substrate surface and a horizontal axis brush with nylon or polypropylene bristles rotates close to the surface. The brush is equal in length to one dimension of the substrate and translates across, allowing full coverage of the surface. While translating, the rotation is initially such that the linear velocity of the bristles in contact with the liquid suspension is in the same direction as the translation and of a higher magnitude. In this manner, the brush forces the collection of emissive elements across the substrate surface. Individual emissive elements are generally moved quickly from their point of dislodgment and travel at a significant initial velocity (similar to brush linear velocity) and travel a distance from the brush before settling on the surface again. It is generally this settling that allows assembly into wells.

Figure 13A:
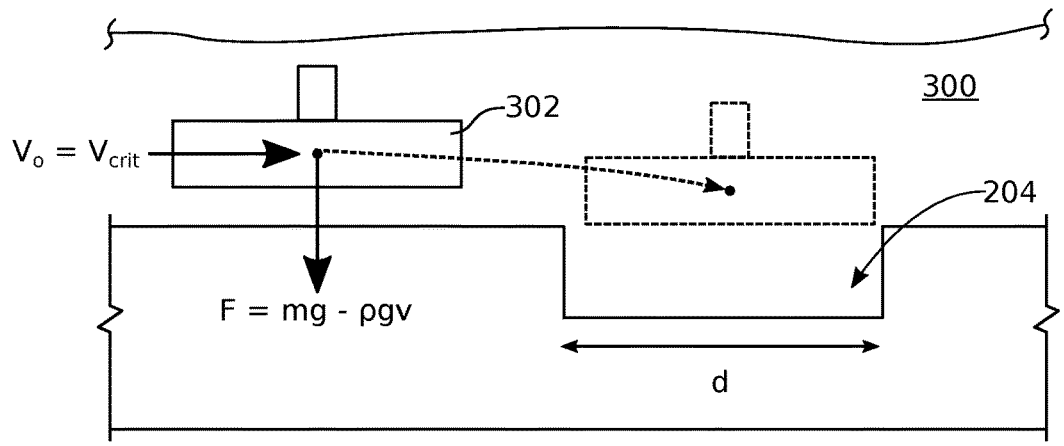
FIGS. 13A through 13C are partial cross-sectional views depicting the influence of trapping velocity on the fluidic assembly of emissive elements.
Figure 13B:
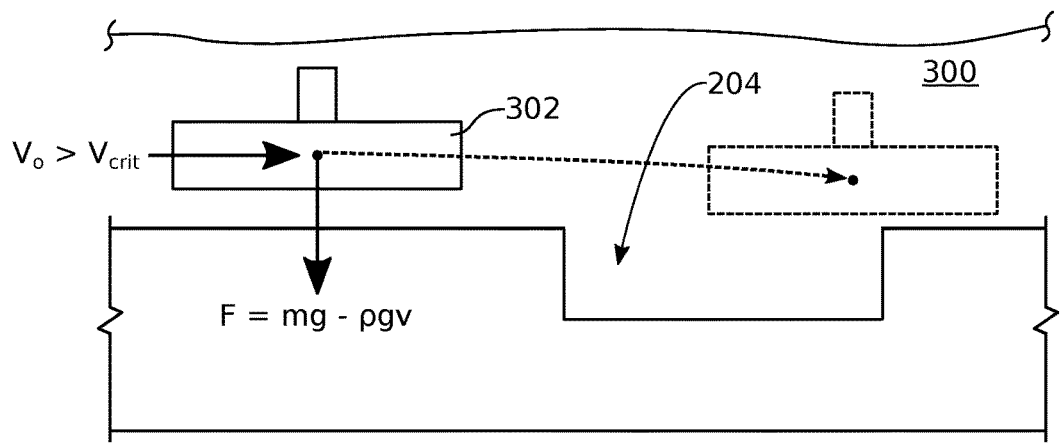
Figure 13C:
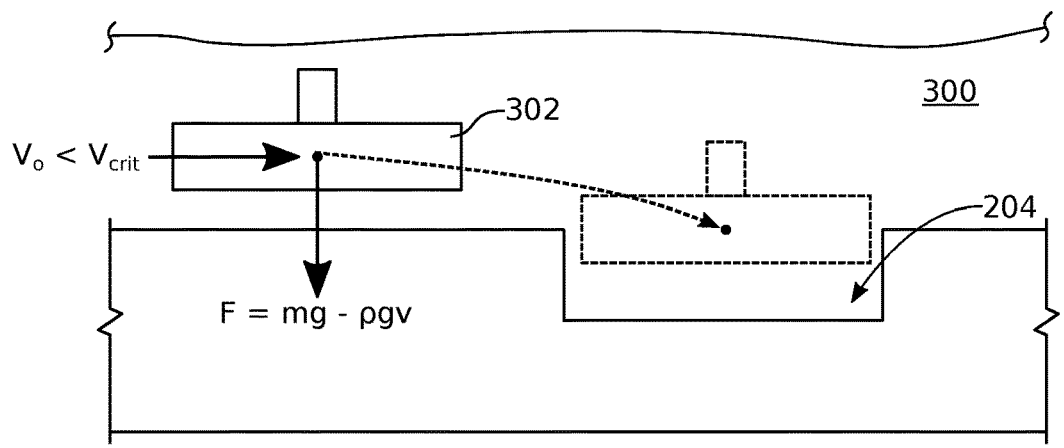

FIGS. 13A through 13C are partial cross-sectional views depicting the influence of trapping velocity on the fluidic assembly of emissive elements. At emissive element velocities ($V_O$) less than or equal to a critical trapping velocity ($V_{CRIT}$), the emissive elements 302 are moving slow enough to be captured in the wells 204. The critical trapping velocity is represented in the initial condition for a emissive element approaching a trapping site well and, combined with fluid dynamics, emissive element and local substrate topography, and initial component location relative to the well, defines a velocity magnitude above which emissive elements are not captured, and below which, emissive elements are captured. The determining factor is whether or not interaction between the well sidewall and the emissive element provides a stopping force on the emissive element. As such, even if the majority of the emissive element sinks below the plane of the substrate top surface, further fluidic forcing drives the emissive element out of the well if the emissive element leading sidewall edge is wholly above the plane of the substrate top surface. Conversely, if the leading edge of the emissive element is caught by the well sidewall, its momentum is transferred to the substrate and it likely settles into the well. The constant downward force on the emissive elements, which does not include forcing from fluid dynamics, is the gravitational force opposed by the buoyant force exerted by the fluid. As such, $V_{CRIT}$ is determined by fluid density as well as by geometry and initial conditions.

The critical trapping velocity is represented in the two dimensions of the figure while, practically, the path of emissive element travel may not be through the well center, and thus include a component moving in or out of the two-dimensional figure. Because the drop of the emissive element prior to contacting the far well sidewall determines whether the emissive element is captured or not, and the on-center approach represents the longest path the emissive element can take without contacting the sidewall, it can be appreciated that significantly lower velocities are required to capture emissive elements that travel off-center of the well. Put another way, the magnitude of the critical trapping velocity is depicted for emissive elements travelling over the center of the well and describes a maximum limit (to the first order) on assembly. To achieve a high yield in practice, minimum emissive element speeds are significantly lower than $V_{CRIT}$ depicted here.

Figure 14:
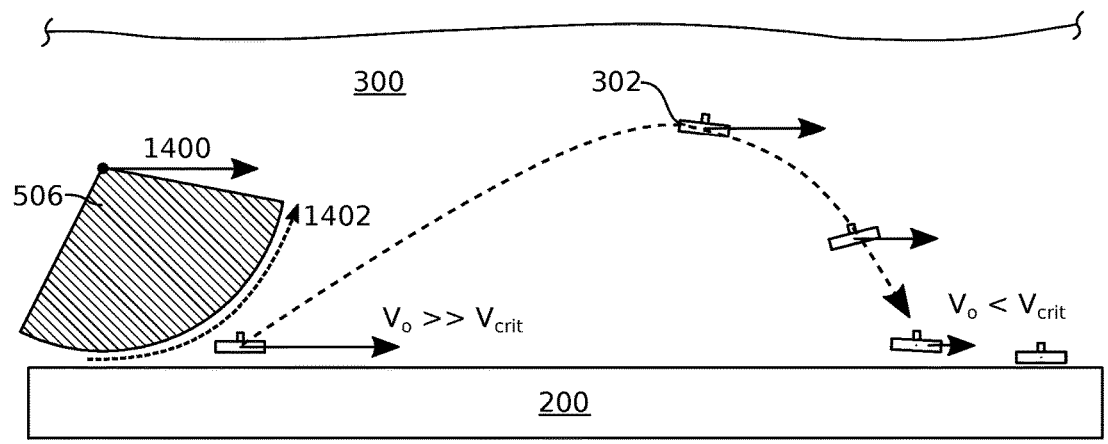
FIG. 14 is a partial cross-sectional view depicting the effect of fluidic assembly suspension fluid drag on emissive element velocity during assembly.

FIG. 14 is a partial cross-sectional view depicting the effect of fluidic assembly suspension fluid drag on emissive element velocity during assembly. At carrier fluid velocities (V) greater than a critical carrier fluid velocity ($V_C$), the brush 506 is likely to propel an emissive disk up, away from the surface of the substrate 202. As shown, the forces on the emissive element 302 may additionally be a function of the transverse velocity 1400 of the brush 506 and the rotation speed 1402 of the brush. The fluid is likely to be turbulent and to some extent the travel of the emissive elements is independent of the overall fluid flow (beyond the initial brush stroke). Typically, there is a high density of emissive elements near the brushing region that are then scattered forward over the substrate, flow through the fluid and experience drag, slow-down, and finally settle on the surface and into wells before the advancing brush reaches them. So the initial velocity is necessarily very high at the brush, but the emissive elements 302 slow down and settle to velocities below $V_{CRIT}$, which is a key benefit of the brush approach. A higher speed bristle detraps misoriented disks and pushes a high-density wave front of emissive elements ahead of it, giving them a chance to settle ahead of the brush. The bristle velocity (predominantly from brush rotating speed) is chosen by the detrapping force window for oriented/misoriented disks, and the linear travel velocity of the brush is chosen by the settling time of the emissive elements in liquid. In this way, this assembly approach decouples the individual emissive element assembly speed, which is limited by $V_{CRIT}$, from the overall display assembly speed, which is fast.

Assembly is rarely complete after a single pass, so additional passes are generally necessary with translation and rotation reversing direction. Translation and rotation need not be reversed at the same time, however. To conserve the population of unassembled components atop the substrate surface (i.e., not located in wells), the rotation reverses first while the brush translates in the same direction as before until all unassembled components are directed back towards the assembly area—at which times the translation of the brush is reversed as well.

In one aspect, the emissive element maximum local density at assembly in one aspect is approximately 0.3-0.8 monolayers of components to allow room for settling with a high number of opportunities for capture. As emissive elements are captured, it is desirable to replenish the population of uncaptured (unaligned) emissive elements and fluid with an additional dosing of suspension in front of the moving brush. Good results are obtained with an excess of components—that is, the number of components in liquid suspension over the assembly area exceeds the number of trapping sites by at least 50% to improve capture yield and decrease assembly time. After all sites (wells) are occupied with a correctly oriented emissive element, the excess unassembled components are swept off using the same brushing tool but with a different protocol (e.g. translating the brush with an extent beyond the substrate area with uniform rotation direction). The swept-off components are collected in a reservoir for reuse (Steps 109a and 109b).

A factor that distinguishes this approach is that electrical contact to components does not occur during assembly or solely through deposited metal after assembly, but rather during an anneal that exceeds the eutectic melt temperature of the emissive element-to-substrate interfacing metal. While some prior art methods include fluxing agents such as HCl in aqueous suspensions for molten solder assembly, this approach gradually dissolves solder contacts, making consistent electrical connection to microcomponents difficult. The concentrations of fluxing agents used herein are initially low enough to not be caustic, but during the anneal, residual isopropanol volatilizes first and then glycerol volatilizes. At each step, the concentration of fluxing agents increases, removing surface oxides and contaminants to allow a clean metal surface for bonding. Unlike pick-and-place methods, this approach achieves good electrical contact without applying any external pressure to the component interface.

In one aspect, Step 106 flows the emissive elements in the suspension, where the emissive elements have a higher percentage of occupied volume than the liquid at the emissive substrate top surface. In a related variation, Step 106 flows the suspension across the emissive substrate top surface by creating a maximum local density of emissive elements in the suspension in the range of 0.3 to 0.8 monolayers.

Figure 6:
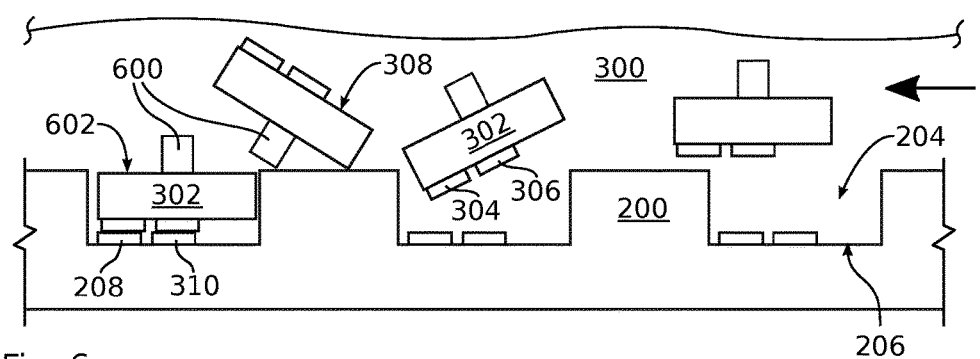
FIG. 6 is a partial cross-sectional view of an emissive substrate being populated by emissive elements having posts.

FIG. 6 is a partial cross-sectional view of an emissive substrate being populated by emissive elements having posts. Viewing FIGS. 1 and 6, Step 104 provides a liquid suspension of emissive elements 302 with a post 600 extending from surface 602. In this example the emissive element is a surface mount emissive element. Step 106 flows the liquid suspension by moving the emissive elements across the substrate top surface, at least partially, in response to torque created on the emissive element posts 600. Further, capturing the emissive elements in the wells (Step 108) may include surface orienting the surface mount emissive element top surfaces 308 directly overlying the well bottom surface in response to the emissive element posts 600.

Figure 12A:
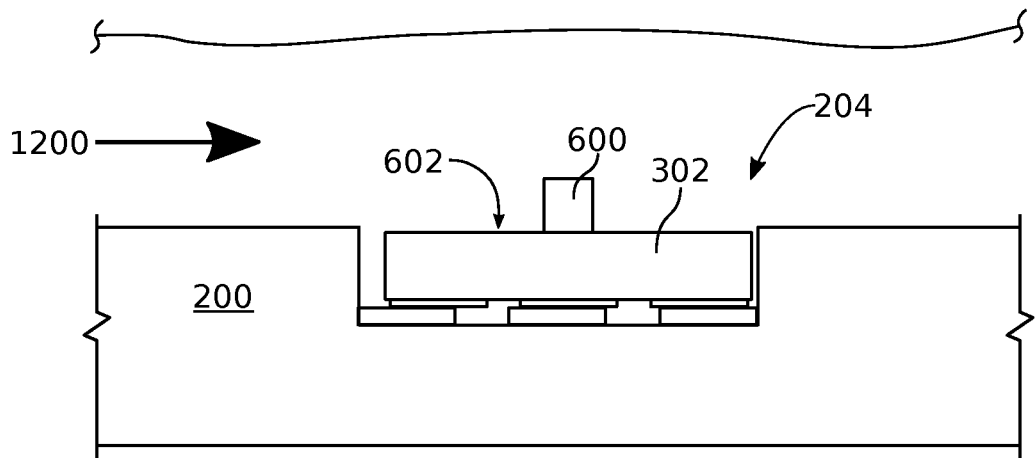
FIGS. 12A and 12B are partial cross-sectional views depicting the function of the post in emissive element surface orientation.
Figure 12B:
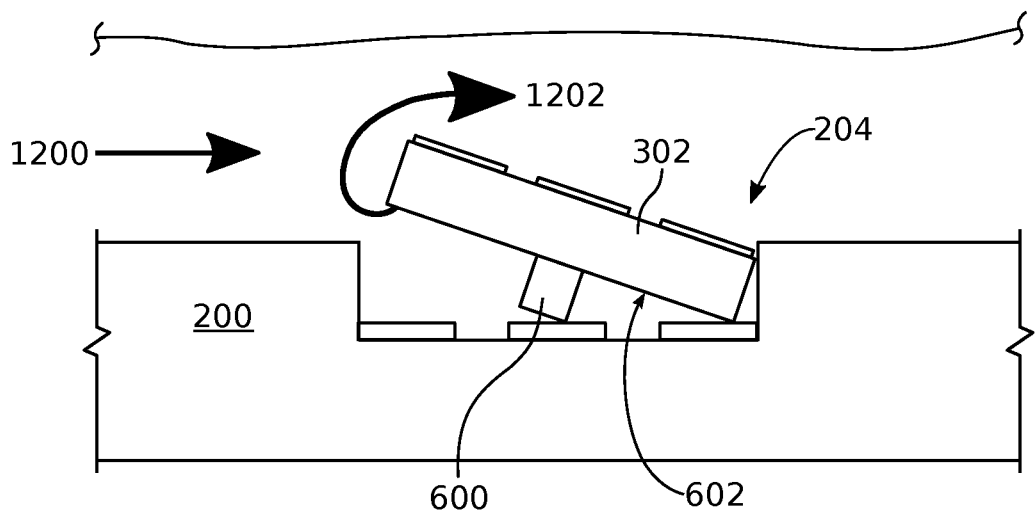

FIGS. 12A and 12B are partial cross-sectional views depicting the function of the post in emissive element surface orientation. During fluidic assembly, a liquid flow (indicated by arrows 1200) results in drag forces on the posts 600 of emissive elements 302 traversing the surface of substrate 200. Because a post 600 extends from the emissive element surface 602, the drag forces have an asymmetric impact on the surface orientation of the plate diodes. In particular, the drag forces result in a positive moment of force about a fixed point of rotation (e.g., an edge of the emissive element in contact with the surface of substrate 200) that flip an inverted emissive element 302 into a non-inverted orientation. In contrast, the drag forces on a non-inverted emissive element 302 due to the liquid flow are primarily due to perturbations around post 600, and the forces exerted on the emissive element 302 lead to a negative net moment of force. This negative net moment forces the leading edge (i.e., the edge leading in the direction of arrows 1200) of the emissive element down and stabilizes the emissive element in the non-inverted orientation.

A similar asymmetric impact of the drag forces occurs between an emissive element 302 deposited in a non-inverted orientation in well 204 (see FIG. 12A), and an emissive element deposited in an inverted orientation in the well 204 (see FIG. 12B). As shown in FIG. 12A, any moment of force around the lower right corner of emissive element 302 caused by the liquid flow is offset by forces exerted on surface 602, resulting in a negative net moment of force tending to maintain the emissive element deposited in well 204. As shown in FIG. 12B, when emissive element 302 is inverted in well 204, surface 602 acts as a hydrofoil generating a lifting force from the liquid flow such that a net positive moment of force results around the right side of emissive element 302 contacting the side of well 204. This net positive moment of force tends to cause the emissive element 302 to flip in a direction indicated by an arrow 1202 such that emissive element is forced out of the well 204 and possibly into a non-inverted orientation as the liquid flow moves the emissive element toward another downstream well where it may re-deposit.

In one aspect, simultaneously with capturing the emissive elements in the wells (Step 108), Step 109b collects the uncaptured emissive elements, and Step 109c resuspends the collected emissive elements for subsequent emissive display fabrication. In another aspect, Step 118 forms a plurality of color modifiers overlying the exposed surfaces of a corresponding plurality of emissive elements. Alternatively or in addition, Step 118 forms a plurality of light diffusers overlying a corresponding plurality of emissive elements.

If the emissive element has two bottom contacts (e.g., a SMLED), annealing (Step 110) is the final processing step, save possibly color modification integration and passivation. If electrodes are on opposite surfaces as in the case of a vertical emissive element, a passivation layer is deposited and opened over the emissive element top surface contacts and patterned metal completes electrical connection to the emissive elements (Steps 114 and 116).

Figure 7:
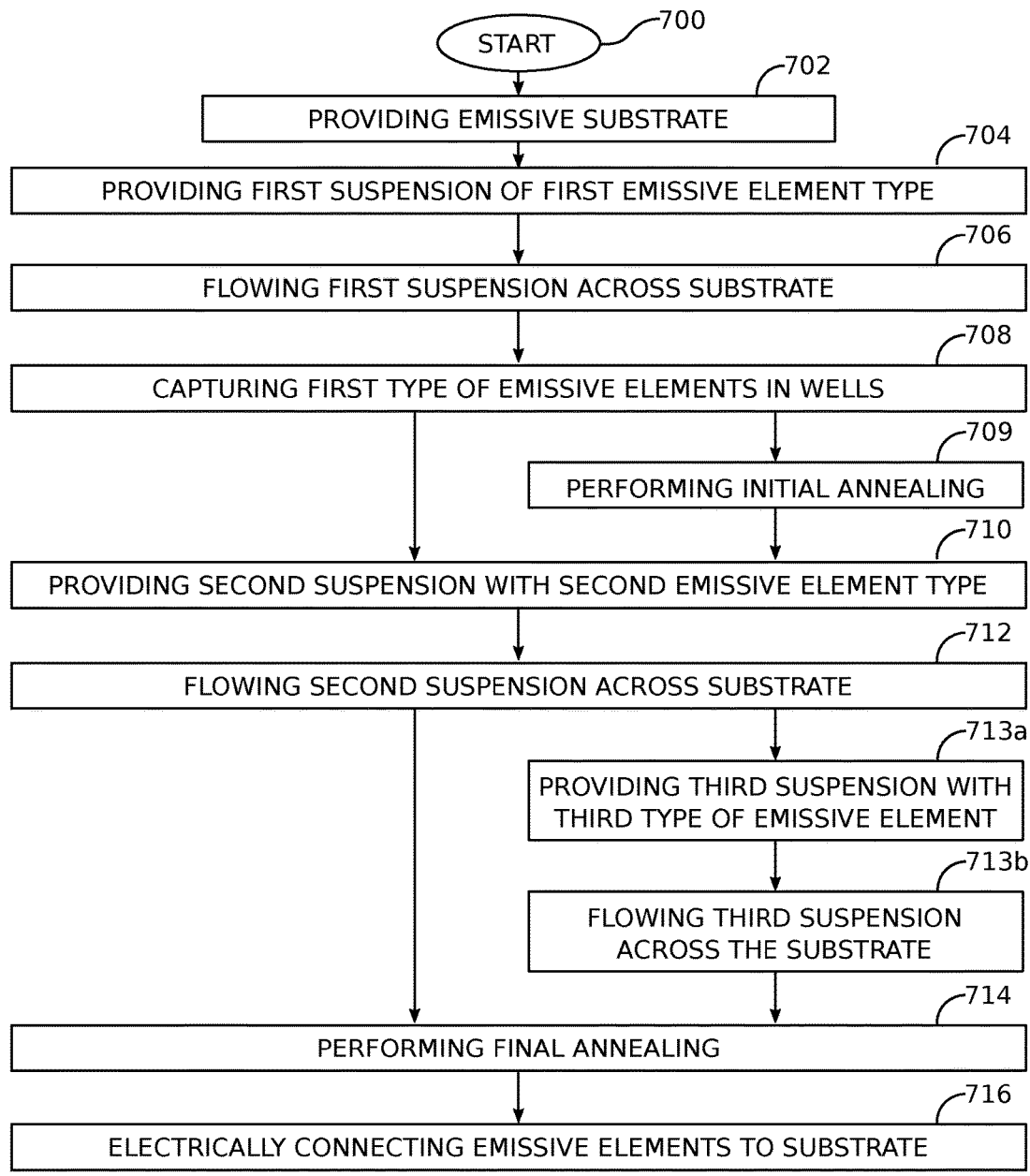
FIG. 7 is a flowchart illustrating a fluidic assembly method first variation for the fabrication of emissive displays.

FIG. 7 is a flowchart illustrating a fluidic assembly method first variation for the fabrication of emissive displays. The method begins at Step 700. Step 702 provides an emissive substrate with a top surface, and a plurality of wells formed in the top surface. Each well comprises a bottom surface with a first electrical interface, and the substrate further includes a matrix of column and row traces forming a first plurality of column/row intersections. Each column/row intersection is associated with a corresponding well. Step 704 provides a first liquid suspension with a first type of emissive elements. Step 706 flows the first suspension across the emissive substrate top surface. Step 708 captures the first type of emissive elements in the wells. Step 710 provides a second liquid suspension with a second type of emissive elements. Step 712 flows the second suspension across the emissive substrate top surface. Step 714 performs a final annealing of the emissive substrate. In response to the final annealing, Step 716 electrically connects emissive elements to the first electrical interface of a corresponding well. In one aspect, prior to flowing the second suspension, Step 709 performs an initial annealing to connect the first type of emissive elements to the electrical interfaces of the wells in which they have been captured. Specific details of the fabrication method can be found in the explanation of FIG. 1, above, and are not repeated here in the interest of brevity. In one aspect, the wells in which the second type of emissive elements are captured are formed after Step 708 and before Step 712.

In one aspect prior to the final annealing in Step 714, Step 713a provides a third liquid suspension with a third type of surface mount emissive elements. Step 713b flows the third suspension across the emissive substrate top surface. Although not shown, an additional step after Step 713b may anneal the third type of emissive elements for connection to the electrical interfaces in the wells in which they have been captured. Although not shown, the method can be extended to deposit any number of the emissive element types in a corresponding number of different suspensions.

Figure 8:
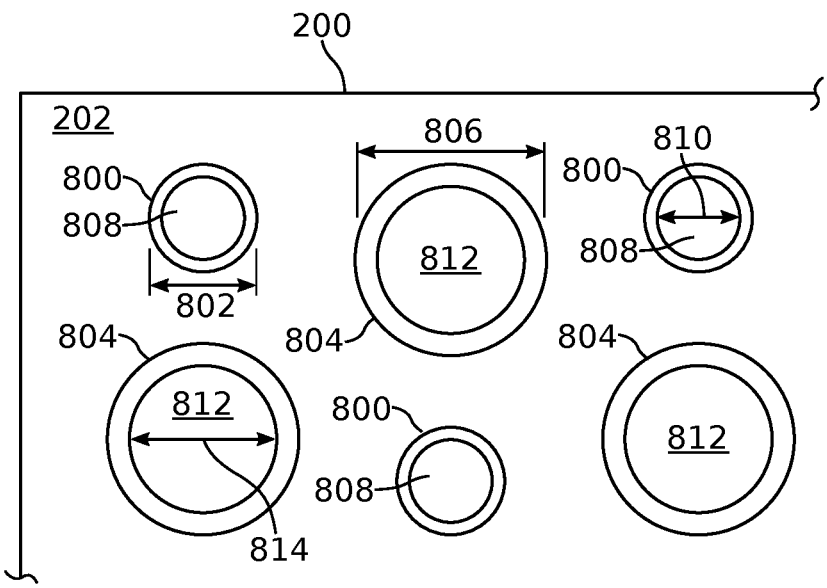
FIG. 8 is a plan view supporting one exemplary version of the method described by FIG. 7.

FIG. 8 is a plan view supporting one exemplary version of the method described by FIG. 7. Here, Step 702 provides an emissive substrate with a plurality of circular wells 804 having a first diameter 806, and a plurality of circular wells 800 having a second diameter 802, less than the first diameter. Then, the first liquid suspension of Step 704 provides a first type of emissive element disks 812 having a round shape with a third diameter 814 greater than the second diameter 802 and less than the first diameter 806. Step 710 provides a second liquid suspension including a second type of emissive element disks 808 having a round shape with a fourth diameter 810 less than the second diameter 802.

Figure 9:
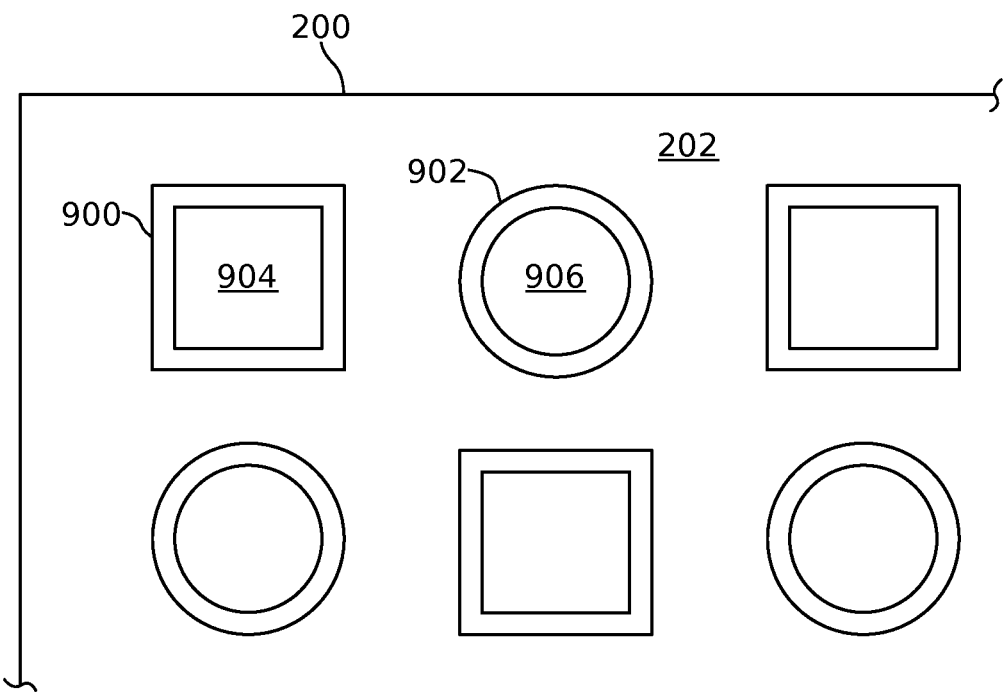
FIG. 9 is a plan view supporting a second exemplary version of the method described by FIG. 7.

FIG. 9 is a plan view supporting a second exemplary version of the method described by FIG. 7. In this aspect, Step 702 provides emissive substrate with a plurality of wells having a first shape 900, and a plurality of wells having a second shape 902, different than the first shape. In this example, the first shape 900 is square and the second shape is circular. However, the method is not limited to any particular shapes or combinations of shapes. Step 704 provides a first liquid suspension with a first type of emissive element having the third shape 904 capable of filling the first shape wells 900, but incapable of filling the second shape wells 902. Step 710 provides a second liquid suspension with a second type of emissive element having a fourth shape 906 capable of filling the second shape wells 902. In one aspect, the emissive elements with the fourth shape 906 are incapable of filling the first shape wells 900.

Figure 10:
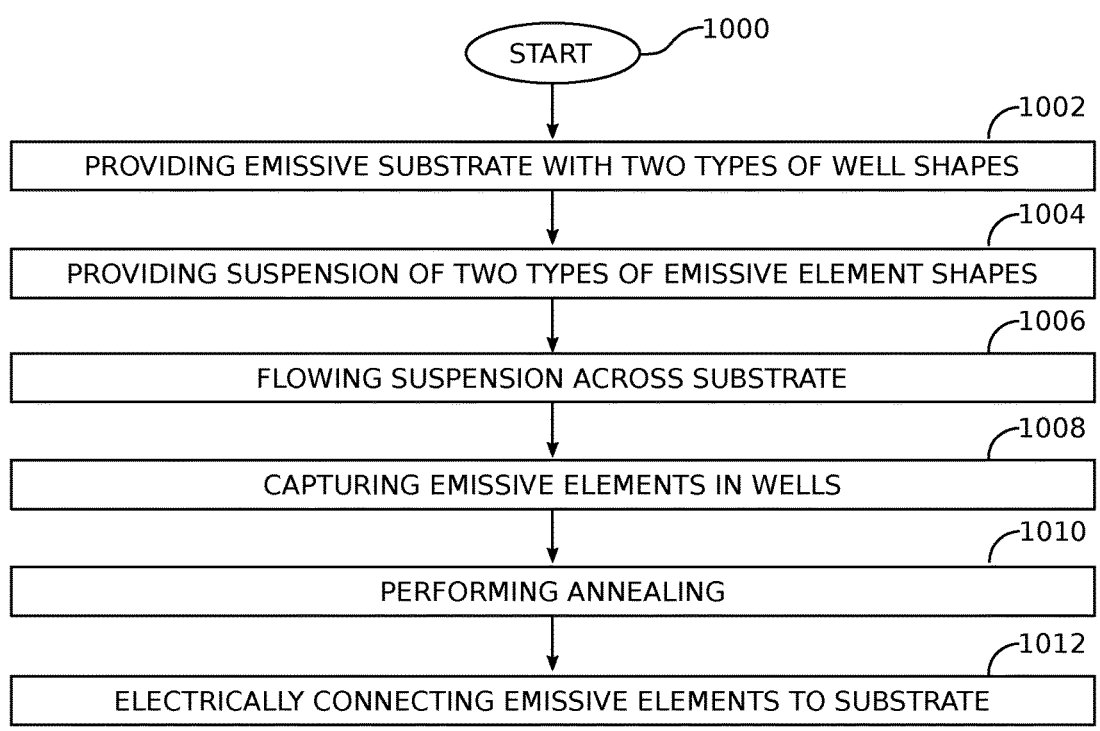
FIG. 10 is a flowchart illustrating a fluidic assembly method second variation for the fabrication of emissive displays.

FIG. 10 is a flowchart illustrating a fluidic assembly method second variation for the fabrication of emissive displays. The method begins at Step 1000. Step 1002 provides an emissive substrate with a top surface, and a plurality of wells having a first shape and a plurality of wells having a second shape, different than the first shape. Each well comprises a bottom surface with a first electrical interface. Step 1002 also provides a matrix of column and row traces forming a first plurality of column/row intersections, where each column/row intersection is associated with a corresponding well. Step 1004 provides a liquid suspension with a first type of emissive element having the third shape capable of filling the first shape wells, but incapable of filling the second shape wells. The liquid suspension of Step 1004 also includes a second type of emissive element having a fourth shape capable of filling the second shape wells, but incapable of filling the first shape wells. Step 1006 flows the suspension across the emissive substrate top surface. Step 1008 captures the first type of emissive elements in the first shape wells and the second type of emissive elements in the second shaped wells. Step 1010 anneals the emissive substrate. In response to the annealing, Step 1012 electrically connects emissive elements to the first electrical interface of a corresponding well.

Fluidic assembly processes have been presented for the fabrication of emissive displays. Examples of particular materials, dimensions, and circuit layouts have been presented to illustrate the invention. However, the invention is not limited to merely these examples. Other variations and embodiments of the invention will occur to those skilled in the art.

We claim:

1. A fluidic assembly method for the fabrication of emissive displays, the method comprising:
   providing an emissive substrate with a top surface, a plurality of wells formed in the top surface, each well comprising a bottom surface with a first electrical interface, and a matrix of column and row traces forming a first plurality of column/row intersections, where each column/row intersection is associated with a corresponding well;
   providing a first liquid suspension with a plurality of first type light emitting diodes (LEDs), each first type LED comprising a post, made from an insulator, extending from a surface;
   flowing the first liquid suspension across the emissive substrate top surface;
   capturing the first type of LEDs in the wells, oriented so that the posts are exposed and extending out of well openings in the emissive substrate top surface;
   providing a second liquid suspension with a plurality of second type LEDs, each second type of LED comprising a post, made from an insulator, extending from a surface;
   flowing the second liquid suspension across the emissive substrate top surface;
   capturing the second type of LEDs in the wells, oriented so that the posts are exposed and extending out of well openings in the emissive substrate top surface;
   performing a final annealing of the emissive substrate; and,
   in response to the final annealing, electrically connecting LEDs to the first electrical interface of corresponding wells.

2. The method of claim 1 further comprising:
   prior to the final annealing, providing a third liquid suspension with a plurality of third type LEDs, each third type of LED comprising a post, made from an insulator, extending from a surface; and,
   flowing the third liquid suspension across the emissive substrate top surface.

3. The method of claim 1 wherein providing the emissive substrate wells includes providing a plurality of circular wells having a first diameter, and providing a plurality of circular wells having a second diameter, less than the first diameter;
   wherein providing the first liquid suspension includes providing first type of LED disks having a round shape with a third diameter greater than the second diameter and less than the first diameter; and,
   wherein providing the second liquid suspension includes providing second type of LED disks having a round shape with a fourth diameter less than the second diameter.

4. The method of claim 1 wherein providing the emissive substrate wells includes providing a plurality of wells having a first shape, and providing a plurality of wells having a second shape, different than the first shape;
   wherein providing the first liquid suspension includes providing a first type of LED having the third shape capable of filling the first shape wells, but incapable of filling the second shape wells; and,
   wherein providing the second liquid suspension includes providing a second type of LED having a fourth shape capable of filling the second shape wells.

5. The method of claim 1 further comprising:
   prior to flowing the second liquid suspension, performing an initial annealing.

6. The method of claim 1 wherein electrically connecting LEDs includes connecting each of the first and second type LEDs to the first electrical interface of corresponding wells without the formation of overlying metal layers, additional conductive traces, or wire bonding on the substrate, subsequent to the final annealing.

7. The method of claim 1 further comprising:
   engaging an auxiliary mechanism for distributing the first and second type of LEDs selected from the group consisting of a brush (rotating or non-rotating), wiper, rotating cylinder, pressurized fluid, and mechanical vibration; and,
   wherein capturing the first and second type of LEDs in the wells includes capturing the first and second type of LEDs in response to the auxiliary mechanism engaging elements selected from the group consisting of the LEDs emissive elements in the first and second liquid suspensions and the emissive substrate top surface.

8. The method of claim 7 wherein providing the emissive substrate includes providing an emissive substrate having a length and a width;
   wherein engaging the auxiliary mechanism includes engaging a brush, having a rotation axis and brush length at least equal to the emissive substrate width, as follows:
   in a first pass, translating the brush length across the emissive substrate length in the first direction;
   simultaneously with the first pass of brush translation, rotating the brush to create a local variance in liquid suspension velocity.

9. The method of claim 8 wherein engaging the auxiliary mechanism includes:
   rotating the brush at a rate in a range of 120 to 300 revolutions per minute (RPM); and,
   translating the brush at a speed in a range of 3 to 10 centimeter per second (cm/s).

10. The method of claim 1 wherein providing the emissive substrate includes providing wells with solder-coated first electrical interfaces.

11. The method of claim 1 wherein flowing the first and second liquid suspensions across the emissive substrate top surface includes creating a maximum local density of first and second type LEDs, respectively, in the first and second liquid suspensions in a range of 0.3 to 0.8 monolayers.

12. The method of claim 1 wherein providing the first and second liquid suspensions of, respectively, first and second type LEDs includes providing first and second type vertical LEDs having a bottom surface with a first electrical contact and a top surface with a second electrical contact, with the post extending from the vertical LED top surface;
   wherein capturing the first and second type LEDs in the wells includes capturing the first and second type LED bottom surfaces directly overlying corresponding well bottom surfaces; and,
   wherein electrically connecting the LEDs to the first electrical interface of corresponding wells includes electrically connecting each first and second type LED first electrical contact to a corresponding well first electrical interface.

13. The method of claim 1 wherein electrically connecting the LEDs includes electrically connecting each first and second type LED to the first electrical interface of corresponding wells without the application of external pressure on the first and second type LEDs.

14. The method of claim 1 wherein flowing the first and second liquid suspensions across the substrate top surface includes moving, respectively, the first and second type LEDs across the substrate top surface at least partially in response to asymmetrical drag forces created by the surface orientation of the first and second type LEDs with respect to the substrate top surface.

15. The method of claim 1 wherein capturing the first and second type LEDs in the wells includes surface orienting the first and second type LED first electrical contacts directly overlying well bottom surfaces in response to the emissive element posts.

16. The method of claim 1 wherein providing the emissive substrate includes each well comprising a bottom surface with both the first electrical interface and a second electrical interface;
wherein providing the first and second liquid suspensions includes providing, respectively, first and second type surface mount LEDs having a bottom surface and a top surface, with a first electrical contact and a second electrical contact formed on the top surface, and with the post extending from the bottom surface;
wherein capturing the first and second type LEDs in the wells includes capturing each first and second type surface mount LED top surface directly overlying a corresponding well bottom surface; and,
wherein electrically connecting the LED to the first electrical interface of corresponding wells includes electrically connecting each first and second type surface mount LED first electrical contact to a corresponding well first electrical interface and each first and second type LED second electrical contact to a corresponding well second electrical interface.

17. The method of claim 1 wherein providing the first and second liquid suspensions comprises providing first and second liquid suspensions including a solder fluxing agent.

18. The method of claim 1 further comprising:
subsequent to capturing the first and second type LEDs in the wells, and prior to the final annealing of the emissive substrate, filling the first and second type LED populated wells with a solder fluxing agent.

19. The method of claim 1 further comprising:
simultaneously with capturing the first and second type LEDs in the wells, collecting uncaptured first and second type LEDs; and,
resuspending the collected first and second type LEDs, respectively in first and second liquid suspensions, for subsequent emissive display fabrication.

20. The method of claim 1 further comprising:
forming a plurality of color modifiers overlying exposed surfaces of a corresponding plurality of LEDs.

21. The method of claim 1 further comprising:
forming a plurality of light diffusers overlying a corresponding plurality of LEDs.

22. The method of claim 1 wherein providing the first and second liquid suspensions includes providing a liquid selected from the group consisting of alcohols, polyols, ketones, halocarbons, and water.

23. The method of claim 1 wherein providing the first and second liquid suspensions includes providing, respectively, first and second type LEDs having solder-coated electrical contacts.

24. The method of claim 1 wherein providing the emissive substrate includes providing the emissive substrate with a plurality of wells having a first shape and a plurality of wells having a second shape, different than the first shape;
wherein providing the first liquid suspension includes providing first type of LEDs having a third shape capable of filling the first shape wells, but incapable of filling the second shape wells;
wherein capturing the first type of LEDs includes capturing the first type of LEDs in the first shape wells;
wherein providing the second liquid suspension includes providing second type LEDs having a fourth shape capable of filling the second shape wells, but incapable of filling the first shape wells; and,
wherein capturing the second type of LEDs includes capturing the second type of LEDs in the second shape wells.

25. The method of claim 24 wherein providing the emissive substrate includes providing the emissive substrate with a plurality of wells having a fifth shape, different than the first and second shapes, comprising a bottom surface with a first electrical interface;
the method further comprising:
prior to performing the final annealing, providing a third liquid suspension including a third type of LED, with a post made from an insulator and extending from a surface, having a sixth shape capable of filling the fifth shape wells, but incapable of filling the first and second shape wells;
flowing the third liquid suspension across the emissive substrate top surface; and,
capturing the third type of LEDs in the sixth shape wells.

26. A fluidic assembly method for the fabrication of emissive displays, the method comprising:
providing an emissive substrate with a top surface, a plurality of wells formed in the top surface, each well comprising a bottom surface with a first electrical interface, and a matrix of column and row traces forming a first plurality of column/row intersections, where each column/row intersection is associated with a corresponding well;
providing a first liquid suspension with a first type of emissive elements, each first type of emissive element having a single post centered on the bottom surface;
flowing the first liquid suspension across the emissive substrate top surface;
capturing the first type of emissive elements in the wells, surface orienting the first type of emissive element top surfaces directly overlying the well bottom surfaces, oriented so that the posts are exposed and extending out of well openings in the emissive substrate top surface, in response to the emissive element posts;
providing a second liquid suspension with a second type of emissive elements, each second type of emissive element having a single post centered on the bottom surface;
flowing the second liquid suspension across the emissive substrate top surface;
capturing the second type of emissive elements in the wells, surface orienting the second type of emissive element top surfaces directly overlying the well bottom surfaces, oriented so that the posts are exposed and extending out of well openings in the emissive substrate top surface, in response to the emissive element posts;
performing a final annealing of the emissive substrate; and,
in response to the final annealing, electrically connecting the emissive elements to the first electrical interface of corresponding wells.

27. A fluidic assembly method for the fabrication of emissive displays, the method comprising:
providing an emissive substrate with a top surface, a plurality of wells formed in the top surface, each well comprising a bottom surface with a first electrical interface, and a matrix of column and row traces forming a first plurality of column/row intersections, where each column/row intersection is associated with a corresponding well;

providing a first liquid suspension with a first type of vertical emissive elements having a top surface with a first electrical contact a bottom surface with a second electrical contact, and a post extending from the top surface;

flowing the first liquid suspension across the emissive substrate top surface;

capturing the first type of emissive elements in the wells, oriented so that the posts are exposed and extending out of well openings in the emissive substrate top surface;

providing a second liquid suspension with a second type of vertical emissive elements having a top surface with a first electrical contact, a bottom surface with a second electrical contact, and a post extending from the top surface;

flowing the second liquid suspension across the emissive substrate top surface;

capturing the second type of emissive elements in the wells, oriented so that the posts are exposed and extending out of well openings in the emissive substrate top surface;

performing a final annealing of the emissive substrate; and, in response to the final annealing, electrically connecting the emissive elements to the first electrical interface of corresponding wells.

28. A fluidic assembly method for the fabrication of emissive displays, the method comprising:

providing an emissive substrate with a top surface, a plurality of wells formed in the top surface, each well comprising a bottom surface with a first electrical interface and a second electrical interface, and a matrix of column and row traces forming a first plurality of column/row intersections, where each column/row intersection is associated with a corresponding well;

providing a first liquid suspension with a plurality of first type light surface mount light emitting diodes (LEDs), each first type surface mount LED comprising a bottom surface and a top surface, with a first electrical contact and a second electrical contact formed on the top surface, and with an insulator material post extending from the bottom surface;

flowing the first liquid suspension across the emissive substrate top surface;

capturing the first type of surface mount LEDs with the top surface directly overlying a corresponding well bottom surface;

providing a second liquid suspension with a plurality of second type surface mount LEDs, each second type surface mount LED comprising a bottom surface and a top surface, with a first electrical contact and a second electrical contact formed on the top surface, and with an insulator material post extending from the bottom surface;

flowing the second liquid suspension across the emissive substrate top surface;

capturing the second type of surface mount LEDs with the top surface directly overlying a corresponding well bottom surface;

performing a final annealing of the emissive substrate; and, electrically connecting each first and second type surface mount LED first electrical contact to a corresponding well first electrical interface and each first and second type LED second electrical contact to a corresponding well second electrical interface.

* * * * *